United States Patent
Ko et al.

(10) Patent No.: US 6,646,448 B2
(45) Date of Patent: Nov. 11, 2003

(54) DATA HEAD WRITER COIL TESTING

(75) Inventors: Beng Theam Ko, Singapore (SG); Eng Hock Lim, Singapore (SG); Myint Ngwe, Singapore (SG); Kah Liang Gan, Singapore (SG); Beng Wee Quak, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/957,940

(22) Filed: Sep. 21, 2001

(65) Prior Publication Data

US 2002/0038191 A1 Mar. 28, 2002

Related U.S. Application Data

(60) Provisional application No. 60/235,611, filed on Sep. 27, 2000.

(51) Int. Cl.[7] ................................................. G01R 31/06
(52) U.S. Cl. ..................... 324/546; 324/522; 324/210; 324/213
(58) Field of Search .................. 324/546, 210, 324/213, 522, 537

(56) References Cited

U.S. PATENT DOCUMENTS

| | | | |
|---|---|---|---|
| 3,943,339 A | 3/1976 | Koerner et al. ............... 235/92 |
| 3,970,925 A | 7/1976 | Procter et al. ................ 324/57 |
| 4,410,926 A | 10/1983 | Hafner et al. ................ 361/93 |
| 4,449,093 A | 5/1984 | Schierjott ..................... 324/57 |
| 4,458,196 A | 7/1984 | Goyal et al. ................... 324/57 |
| 4,746,869 A | * 5/1988 | Schrag et al. ................ 324/546 |
| 4,764,724 A | 8/1988 | Marugg ....................... 324/230 |
| 4,835,471 A | 5/1989 | Kutilin ........................ 324/236 |
| 5,005,089 A | 4/1991 | Thanos et al. ........... 360/77.08 |
| 5,078,010 A | 1/1992 | Lock ............................ 73/304 |
| 5,084,791 A | 1/1992 | Thanos et al. ........... 360/77.04 |
| 5,087,884 A | 2/1992 | Brannon ..................... 324/523 |
| 5,518,326 A | * 5/1996 | Yoshino et al. ................ 400/74 |
| 5,717,547 A | 2/1998 | Young ......................... 360/104 |
| 5,748,573 A | 5/1998 | Ohmori ....................... 369/13 |
| 5,812,344 A | 9/1998 | Balakrishnan ............... 360/104 |
| 6,060,887 A | 5/2000 | Nakamura et al. .......... 324/546 |
| 6,081,396 A | 6/2000 | Ryat ............................ 360/46 |
| 6,104,199 A | 8/2000 | Sako ........................... 324/546 |
| 6,335,842 B1 | * 1/2002 | Kotani ......................... 360/53 |
| 6,404,594 B1 | * 6/2002 | Maruyama et al. ...... 360/245.8 |

* cited by examiner

*Primary Examiner*—N. Le
*Assistant Examiner*—John Teresinski
(74) *Attorney, Agent, or Firm*—Westman, Champlin & Kelly, P.A.

(57) ABSTRACT

A writer coil in a data head of a data storage system is tested by coupling detection circuitry to the writer coil and driving the writer coil with a periodic pulse signal generated by the detection circuitry. As a result, voltage is generated, with the detection circuitry, as a function of an inductance of the writer coil. An inductance of the writer coil is calculated as a function of the generated voltage. Electrical short circuits and discontinuities in the writer coil are identified as a function of the calculated inductance.

14 Claims, 5 Drawing Sheets

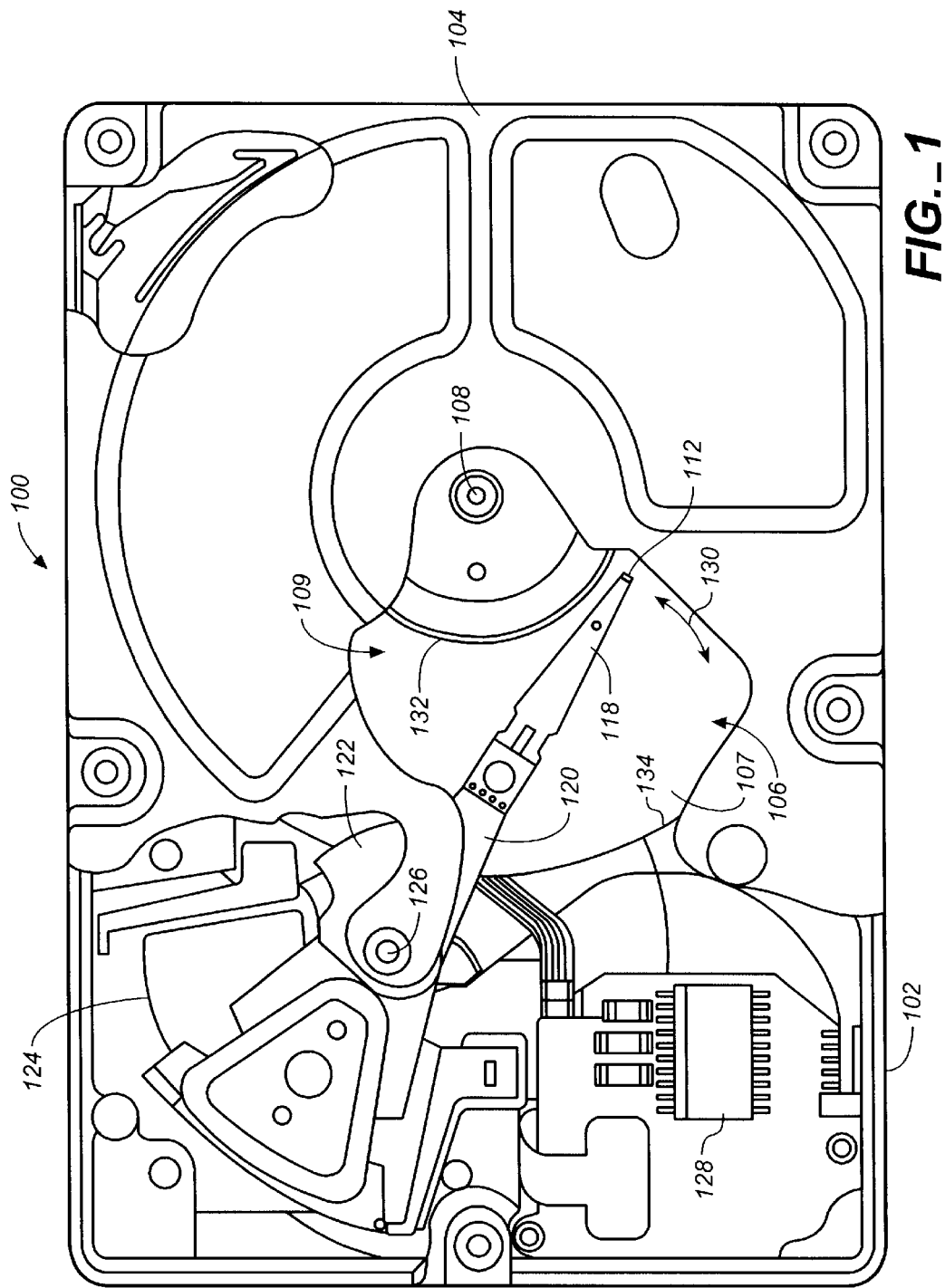
FIG._1

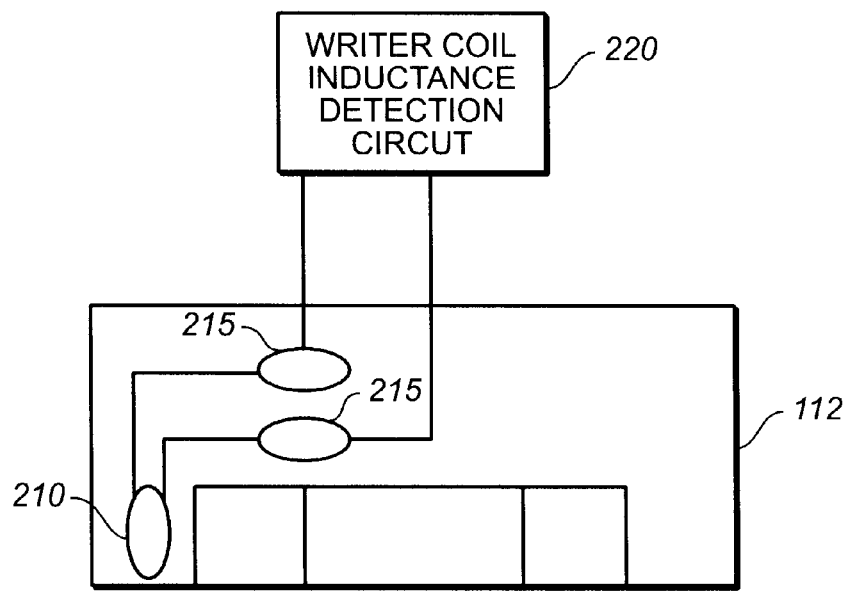
FIG._2
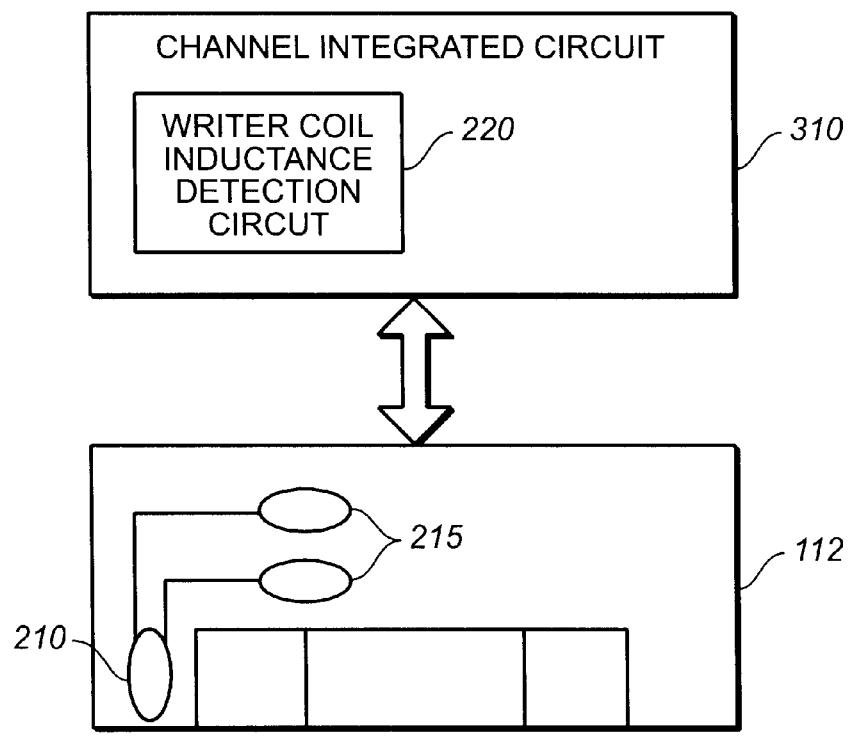
FIG._3

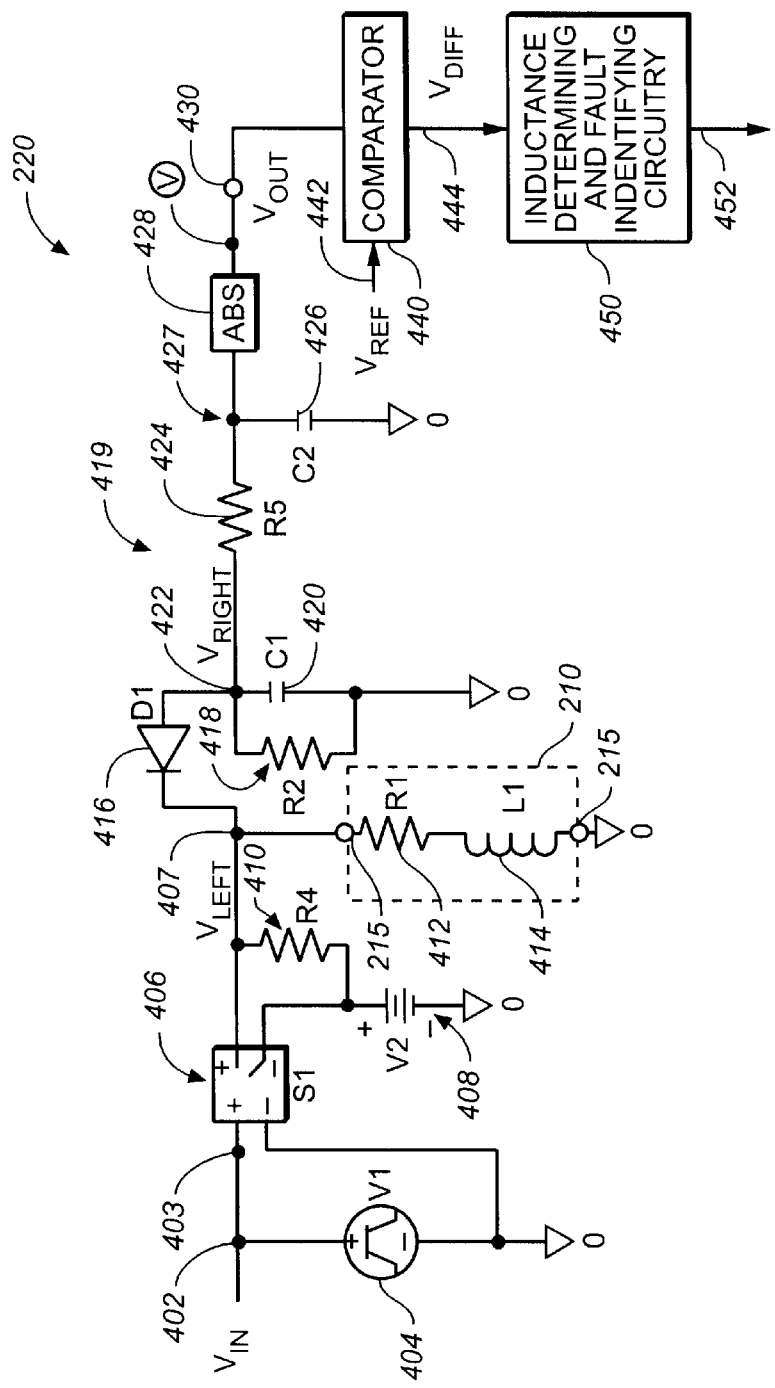
FIG._4

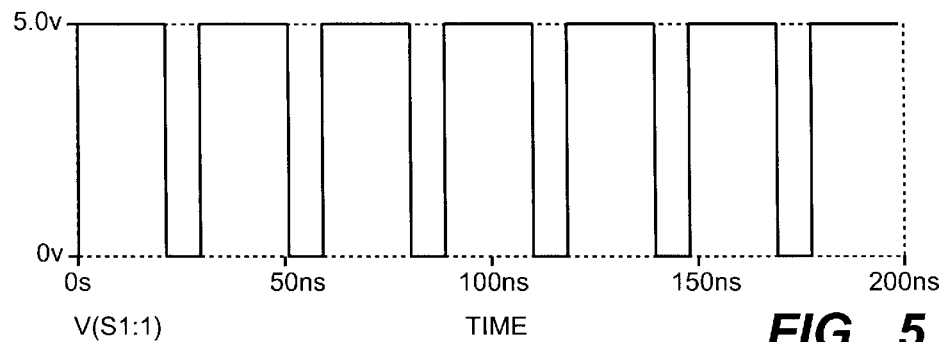
*FIG._5*
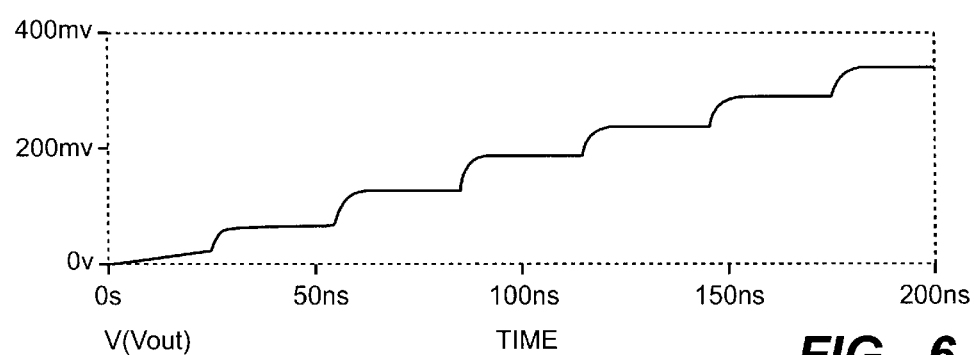
*FIG._6*
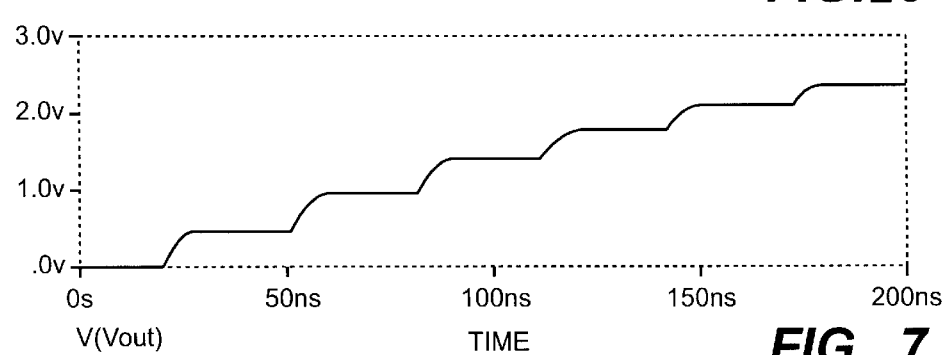
*FIG._7*
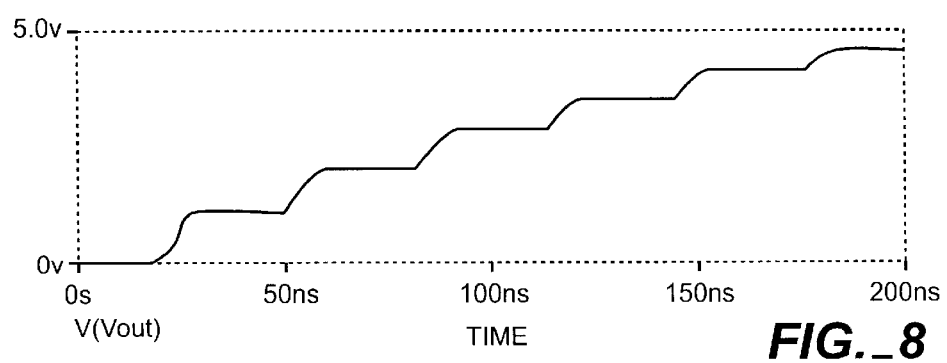
*FIG._8*

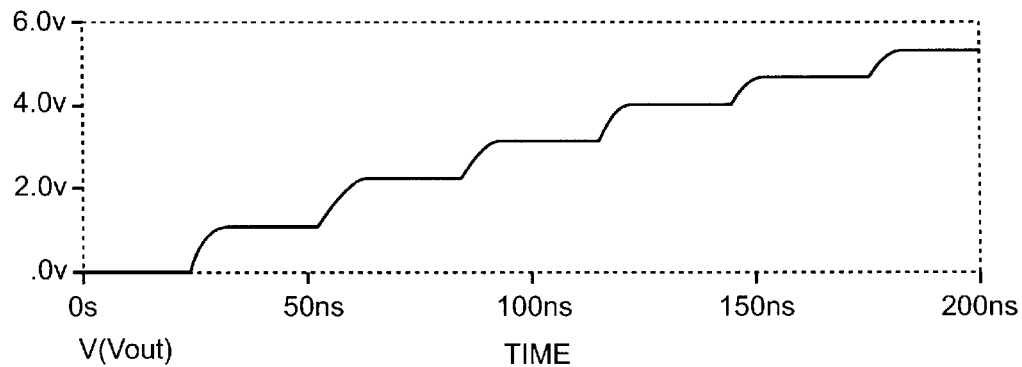
FIG._9
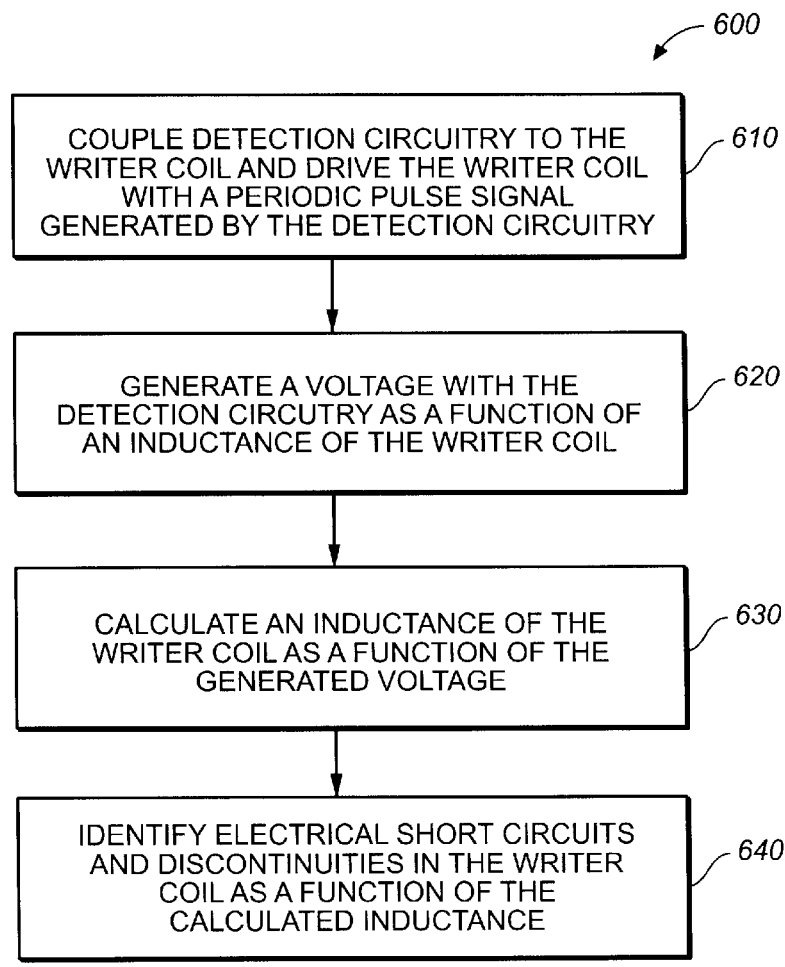
FIG._10

DATA HEAD WRITER COIL TESTING

CROSS-REFERENCE TO RELATED APPLICATION

This application claims priority from U.S. Provisional Application No. 60/235,611, filed Sep. 27, 2000, and entitled "INTELLIGENT WRITER INDUCTANCE DETECTION METHOD".

FIELD OF THE INVENTION

The present invention relater generally to data storage systems and more particularly, but not by limitation, to testing writer coils in data heads of a data storage system.

BACKGROUND OF THE INVENTION

Data storage systems often utilize a data head having an inductive write transducer to store data on a surface of a recording media such as a disc. For example, in magnetic disc drive data storage systems, the data head associated with each disc surface will frequently include a magnetoresistive (MR) or a giant magnetoresistive (GMR) transducer (read head or reader) which reads magnetically stored data from the disc and a write transducer (write head r writer) which is used to write data to the disc. The write transducer of this type of data head typically includes a metallic coil through which current is passed to generate the magnetic fields necessary to write data to a surface of the disc.

In the writer coil of a data head, the coil inductance is linearly proportional to the number of turns in the coil, and is dependent upon the materials used and the conducting current. A coil with an open circuit (electrical discontinuity) wilt have zero admittance, while a completely electrically shorted coil will have infinite admittance. An insufficient number of turns in the coil can result in write failures due to weaker than necessary magnetic fields.

Lower than desired inductance values for the writer coil are typically caused by insufficient numbers of coil turns, having a partial short circuit in portions of the coil, or by other manufacturing faults. Infinite impedance is the other common symptom in writer faults, when the metallic coil becomes discontinuous and does not generate magnetic flux. Contemporary application specific integrated circuit (ASIC) technology has been used to produce numerous integrated circuit (IC) configurations which are capable of detecting writer coil open circuits (discontinuities), because of the simplicity required to detect this type of defect. However, it is far more difficult to detect short circuit defects in the writer coil. Since it is very desirable to filter out undesired writer conditions in head gimbal assemblies (HGAs) before being built into the finalized disc drive, an apparatus and associated method of detecting both electrical short circuits and discontinuities in the writer coil would be a significant improvement in the art.

SUMMARY OF THE INVENTION

Embodiments of the present invention relate to data storage systems which utilize a data head having a writer coil, and to apparatus and associated methods of identifying electrical faults in the writer coil.

In accordance with one embodiment of the present invention, an apparatus and associated method of testing a writer coil in a data head of a data storage system includes the steps of coupling detection circuitry to the writer coil and driving the writer coil with a periodic pulse signal generated by the detection circuitry. Next, a voltage is generated, with the detection circuitry, as a function of an inductance of the writer coil. Then, an inductance of the writer coil is calculated as a function of the generated voltage. Electrical short circuits and discontinuities in the writer coil are then identified as a function of the calculated inductance. An inductance detection circuit and a disc drive incorporating the circuit and the method are also disclosed.

These and various other features as well as advantages which characterize embodiments of the present invention will be apparent upon reading of the following detailed description and review of the associated drawings.

BRIEF DESCRIPTION OF THE DRAWINGS

FIG. 1 is a plan view of a disc drive in accordance with embodiments of the present invention.

FIG. 2 is a diagrammatic illustration of a data head and a writer coil inductance detection circuit which can be included in the disc drive illustrated in FIG. 1.

FIG. 3 is a diagrammatic illustration of the data head and detection circuits shown in FIG. 2, but showing the detection circuit at least partially implemented in the channel integrated circuit.

FIG. 4 is a circuit diagram illustrating one embodiment of the detection circuit illustrated in FIGS. 2 and 3.

FIG. 5 is a plot illustrating an input waveform to the circuit shown in FIG. 4.

FIGS. 6–9 are plots illustrating output waveforms from the circuit shown in FIG. 4, in response to the input waveform shown in FIG. 5, for various writer coil inductances.

FIG. 10 is a block diagram illustrating a method of the present invention.

DETAILED DESCRIPTION OF ILLUSTRATIVE EMBODIMENTS

FIG. 1 is a plan view of a disc drive 100 which includes a housing with a base 102 and a top cover 104 (sections of top cover 104 are removed for clarity). Disc drive 100 further includes a disc pack 106 which is mounted on a spindle motor (not shown). Disc pack 106 includes a plurality of individual discs 107 which are mounted for co-rotation about central axis 108. Each disc 107 has an associated product head 112 which carries one or more read and write transducers (read and write heads) for communicating with disc surface 109. Each product head 112 is supported by a suspension 118 which is in turn attached to a track accessing arm 120 of an actuator assembly 122. Actuator assembly 122 is rotated about a shaft 126 by a voice coil motor 124, which is controlled by servo control circuitry within internal circuit 128, to move head 112 in an arcuate path 130 between a disc inner diameter 132 and a disc outer diameter 134.

Embodiments of the present invention include a new writer inductance detection circuit and method, as well as disc drive 100 which incorporates the circuit and method. The writer inductance detection circuit and method in one embodiment of the present invention can be implemented using the channel IC of the disc drive or, using discrete circuitry separate from the channel IC, or a combination of these two methods. Circuitry 128 shown in FIG. 1 is diagrammatically representative of various circuitry associated with disc drive 100 including the inductance detection circuitry, the channel IC, the servo control circuitry, and any other circuitry associated with the disc drive. Embodiments of the present invention can be implemented in a fully or partially assembled disc drive 100. For example, implementation can occur after the HGA fabrication stages of the disc drive for purposes of identifying writer coil short circuits or discontinuities, as well as for identifying the writer coil inductance for purposes of optimizing write current control settings.

FIG. 2 is a diagrammatic illustration of writer coil inductance detection circuit 220 operably coupled to writer coil 210 of product or data head 112 in accordance with embodiments of the present invention. Writer coil inductance detection circuitry 220 provides an apparatus and method of testing the writer coil 210 for both electrical short circuits and discontinuities. In embodiments of the present invention, writer coil inductance detection circuitry 220 is operably coupled to writer coil 210 via the electrical contact pads 215 positioned on a surface of head 112. Electrical contact pads 215 can be the same electrical contact pads used by the channel IC to control the write transducer in order to write data to a surface of a data storage disc. Thus, in some embodiments of the present invention, detection circuitry 220 is implemented within the same ASIC used to implement the channel IC. This embodiment is illustrated diagrammatically in FIG. 3, with detection circuitry 220 being implemented within the ASIC of channel IC 310.

FIG. 4 is a schematic diagram of an inductance detection circuit 220 in accordance with one embodiment of the present invention. As shown in FIG. 4, detection circuit 220 is adapted to operably couple to writer coil 210 via electrical contact pads 215. In the particular configuration shown, one electrical contact pad 215 is connected to node 407 (Vleft) in circuit 220, while the other electrical contact pad 215 is coupled to ground or to a reference voltage used in circuit 220. Circuit 220 includes input 402 (Vin), pulse generator 404 (V1), switch breaker 406 (S1), voltage source 408 (V2), resistor 410 (R4), node 407 (Vleft), diode 416 (D1), resistor 418 (R2), capacitor 420 (C1), node 422 (Vright), resistor 424 (R5), capacitor 426 (C2), absolute value converter 428, and output 430. Circuit 220 can also include comparator 440 and inductance determining and fault identifying circuitry 450. In an example embodiment, the above listed components have the following values: resistor R4 410 is 1000 kohm; resistor R2 418 is 1 kohm; capacitor C1 420 is 300 picofarad; resistor R5 424 is 100 ohms; and capacitor C2 426 is 300 picofarad. However, the present invention is not limited to any specific component values.

Inductor 414 (L1) represents the inductance of writer coil 210, and resistor 412 (R1) represents the writer coil resistance. As an example, typical values for inductor L1 414 and resistor R1 412 are 25 nano-Henry (nH) and 6 Ohms, respectively. However, these values can vary greatly, and this emphasizes a benefit of embodiments of the present invention.

The coil current can normally be measured by introducing a series resistor to the writer. However, the series resistor limits the current flow and affects the rising and falling time performance. As a result, the addition of a resistor in series with coil 210 is not preferred. Circuit 220 provides an apparatus and method for determining the inductance of writer coil 210 without loading the writer with any passive components which can degrade the electrical performance of the write head.

The periodic pulse signal used to drive writer coil 210 can be generated within circuit 220, or can be provided to circuit 220 via input Vin 402. For example, in embodiments in which circuit 220 is implemented at least partially outside of the channel IC, the periodic pulse signal can be generated by the channel IC and supplied to circuit 220 via input Vin 402. In one embodiment, pulse generator V1 404 generates a five volt periodic square pulse with a 20 nanosecond (ns) pulse width (for example, having a delay of zero ns, a rising time and falling time equal to 1 ns, and a period equal to 30 ns). Voltage source V2 408 is a DC supply voltage coupled to switch breaker S1 406, and resistor R4 410 is an isolation resistance for the non-ideal switch 406. Like the periodic pulse signal, voltage source V2 408 can be supplied by the channel IC. Switch breaker S1 406 serves to protect coil 210 from over voltage situations.

Resistor R2 418 functions to form a voltage drop Vright 422, and capacitor C1 420 is used to store the charge resulting from this voltage drop. Resistor R5 424 and capacitor C2 426 combine to function as a low pass filter 427 for filtering the voltage signal Vright 422. Absolute value converter 428 transforms the output of the low pass filter to its absolute value at output Vout 430. Diode D1 416 isolates writer coil 210 from the output portion of the circuit, thus preventing the output circuit from loading the writer coil 210. Resistor R2 418, capacitor C1 420, low pass filter 427 and absolute value converter 428 together function as output circuitry 419 configured to generate output Vout 430.

FIG. 5 is a plot illustrating a periodic pulse input waveform Vin 402 used to drive writer coil 210 during a test phase. FIGS. 6–9 are plots of output waveforms Vout 430 when the inductance L1 414 of coil 210 is 5 nH, 25 nH, 60 nH, and 100 nH, respectively. These plots are useful in understanding the operation of circuit 220, which is described as follows. At the rising edge of Vleft 407 (i.e., Vin 402 unless switch S1 406 has broken the circuit), coil 210 begins to store magnetic energy until reaching its saturation point. At the same time, capacitor C1 420 is charged, producing voltage Vright 422. The charge stored in capacitor C1 420 is discharged through diode D1 416 and coil 210 on the falling edge of Vright 422 and Vleft 407. However, the magnetic energy stored in coil 210 limits the discharging current on the falling edge. The higher the inductance L1 414 of coil 210, the smaller the discharging current will be, and the higher voltage Vright 422 will stay before the next rising edge occurs. Thus, circuit 220 forms a ladder circuit which stacks up charge on Vright 422 on every rising edge.

As can be seen in FIGS. 6–9, any change in inductance of writer coil 210 causes significant changes in output voltage Vout 430. By comparing output Vout 430 to a known variable reference voltage Vref 442, a difference voltage Vdiff 444 indicative of the inductance of writer coil 210 can be determined. Inductance determining and fault identifying circuitry 450, which can be a suitably programmed processor or other dedicated circuitry, then uses the difference voltage Vdiff 444 to determine the inductance of coil 210. Using look-up tables or by algorithmic methods or functions, circuitry 450 can convert voltage Vdiff 444 into a writer coil inductance value, differentiating the writer coil inductance to within an accuracy of at least 1 nH.

Circuitry 450 then compares the calculated inductance to a first threshold inductance, for example 10 nH, to determine if the writer coil contains a short circuit. If the inductance L1 414 of coil 210 is less than the first threshold inductance, then the data head 112 is identified at output 452 as having a short circuit in the writer coil. Circuitry 450 also compares the calculated inductance to a second threshold inductance, for example 30 nH, to determine if the writer coil has a discontinuity. If the inductance L1 414 of coil 210 is greater than the second threshold, then the data head 112 is identified at output 452 as having an electrical discontinuity. If either of these defects are detected, appropriate action can be taken. For example, the head gimbal assembly (HGA) containing the defective data head can be replaced, or the entire drive can be scrapped or reworked.

In summary, embodiments of the present invention include an apparatus and method of testing a writer coil 210 in a data head 112 of a data storage system 100. A method in accordance with an embodiment herein is shown in FIG. 10 and includes step 610 of coupling detection circuitry 220 to the writer coil 210 and driving the writer coil with a periodic pulse signal V1 404/Vin 402 generated by the detection circuitry. As shown at step 620, then generating a voltage Vout 430, with the detection circuitry, as a function of an inductance of the writer coil. Next, as shown at step 630, calculating an inductance L1 414 of the writer coil as a function of the generated voltage Vout 430. Then, as illustrated at step 640, identifying electrical short circuits and discontinuities in the writer coil 210 as a function of the calculated inductance.

In some embodiments of the invention, method step 640 further includes the steps of comparing the calculated inductance to a first threshold inductance, and identifying the writer coil as containing a short circuit if the writer inductance is below the first threshold inductance. In one embodiment, the first threshold inductance is approximately 10 nH. Step 640 can further include the steps of comparing the calculated inductance to a second threshold inductance, and identifying the writer coil as containing a discontinuity if the writer inductance is above the second threshold inductance. In one embodiment, the second threshold inductance is equal to approximately 30 nH.

In some embodiments, method step 610 further includes coupling the detection circuitry 220 to electrical contact pads 215 positioned on a surface of the data head 112, with the electrical contact pads 215 being operably coupled to the writer coil 210. In still other embodiments, method step 610 includes coupling read channel circuitry 310 to the electrical contact pads 215, wherein the read channel circuitry includes at least a portion of the detection circuitry 220.

In some embodiments of the invention, a method further includes the step of establishing write current parameters for the data head based upon the calculated inductance in order to optimize the write current for the data head.

Embodiments of the present invention also include a data storage system 100 including a data head 112 having a writer coil 210 embedded therein, and having detection circuitry 220 operably coupled to the writer coil and configured to calculate an inductance of the writer coil. In some embodiments, the data storage system further includes a periodic pulse generator V1 404 operably coupled to the writer coil 210 and configured to drive the writer coil with a periodic pulse signal. The data storage system also includes output circuitry 419 operably coupled to the writer coil 210 and configured to generate an output signal Vout 430 as a function of the inductance of the writer coil, and inductance determining circuitry 440,450 operably coupled to the output circuitry and configured to calculate the inductance of the writer coil as a function of a voltage of the output signal. The data storage system can also include condition identifying circuitry 450 operably coupled to the inductance determining circuitry and configured to identify electrical short circuits and discontinuities in the writer coil as a function of the calculated inductance. The condition identifying circuitry is configured to compare the calculated inductance to a first threshold inductance and to identify the writer coil as containing a short circuit if the calculated inductance is below the first threshold inductance. The condition identifying circuitry is also configured to compare the calculated inductance to a second threshold inductance and to identify the writer coil as containing a discontinuity if the calculated inductance is above the second threshold inductance. Once again, the data storage system also includes, in some embodiments, read channel circuitry 310 operably coupled to the data head 112, wherein the read channel circuitry includes at least a portion of the detection circuitry 220.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the inductance detection method and circuit while maintaining substantially the same functionality without departing from the scope and spirit of the present invention. In addition, although the preferred embodiment described herein is directed to an inductance detection method and circuit for a disc drive data storage system, it will be appreciated by those skilled in the art that the teachings of the present invention can be applied to other systems, like magnetic tape data storage system, without departing from the scope and spirit of the present invention.

What is claimed is:

1. A method of testing a writer coil in a data head of a data storage system, the method comprising the steps of:
   (A) coupling detection circuitry to the writer coil and driving the writer coil with a periodic pulse signal generated by the detection circuitry;
   (B) generating a ladder voltage signal, with the detection circuitry, as a function of an inductance of the writer coil and in response to the periodic pulse signal;
   (C) calculating an inductance of the writer coil as a function of the generated ladder voltage signal; and
   (D) identifying electrical short circuits and discontinuities in the writer coil as a function of the calculated inductance.

2. The method of claim 1, wherein step (D) further comprises the steps of:
   (D)(1) comparing the calculated inductance to a first threshold inductance; and
   (D)(2) identifying the writer coil as containing a short circuit if the writer inductance is below the first threshold inductance.

3. The method of claim 2, wherein the first threshold inductance is equal to approximately 10 nH.

4. The method of claim 1, wherein step (D) further comprises the steps of:
   (D)(1) comparing the calculated inductance to a second threshold inductance; and
   (D)(2) identifying the writer coil as containing a discontinuity if the writer inductance is above the second threshold inductance.

5. The method of claim 4, wherein the second threshold inductance is equal to approximately 30 nH.

6. The method of claim 1, wherein step (A) further comprises coupling the detection circuitry to electrical contact pads positioned on a surface of the data head, the electrical contact pads being operably coupled to the writer coil.

7. The method of claim 6, wherein step (A) further comprises coupling read channel circuitry to the electrical contact pads, wherein the read channel circuitry includes at least a portion of the detection circuitry.

8. The method of claim 1, and further comprising step (E) of establishing write current parameters for the data head based upon the calculated inductance.

9. A data storage system comprising:

a data head having a writer coil embedded therein; and detection circuitry operably coupled to the writer coil and configured to calculate an inductance of the writer coil, wherein the detection circuitry comprises a ladder circuit operably coupled to the writer coil and configured to drive the writer coil with a periodic pulse signal and to generate a ladder output signal as a function of the inductance of the writer coil and in response to the periodic pulse signal.

10. The data storage system of claim 9, wherein the ladder circuit comprises:

a periodic pulse generator operably coupled to the writer coil and configured to drive the writer coil with the periodic pulse signal;

output circuitry operable coupled to the writer coil and configured to generate the ladder output signal as the function of the inductance of the writer coil; and inductance determining circuitry operably coupled to the output circuitry and configured to calculate the inductance of the writer coil as a function of a voltage of the ladder output signal.

11. The data storage system of claim 10, and further comprising condition identifying circuitry operably coupled to the inductance determining circuitry and configured to identify electrical short circuits and discontinuities in the writer coil as a function of the calculated inductance.

12. The data storage system of claim 11, wherein the condition identifying circuitry is configured to compare the calculated inductance to a first threshold inductance and to identify the writer coil as containing a short circuit if the calculated inductance is below the first threshold inductance.

13. The data storage system of claim 11, wherein the condition identifying circuitry is configured to compare the calculated inductance to a second threshold inductance and to identify the writer coil as containing a discontinuity if the calculated inductance is above the second threshold inductance.

14. The data storage system of claim 9, and further comprising read channel circuitry operably coupled to the data head, wherein the read channel circuitry includes at least a portion of the detection circuitry.

* * * * *